United States Patent
Ueyama

(10) Patent No.: US 9,972,926 B2
(45) Date of Patent: May 15, 2018

(54) ELECTRIC COMPONENT SOCKET

(71) Applicant: ENPLAS CORPORATION, Kawaguchi-shi, Saitama (JP)

(72) Inventor: Yuki Ueyama, Kawaguchi (JP)

(73) Assignee: ENPLAS CORPORATION, Kawaguchi (JP)

(*) Notice: Subject to any disclaimer, the term of this patent is extended or adjusted under 35 U.S.C. 154(b) by 0 days. days.

(21) Appl. No.: 15/534,757

(22) PCT Filed: Dec. 1, 2015

(86) PCT No.: PCT/JP2015/083735
§ 371 (c)(1),
(2) Date: Jun. 9, 2017

(87) PCT Pub. No.: WO2016/093113
PCT Pub. Date: Jun. 16, 2016

(65) Prior Publication Data
US 2017/0373416 A1    Dec. 28, 2017

(30) Foreign Application Priority Data
Dec. 11, 2014  (JP) .................... 2014-250548

(51) Int. Cl.
*G01R 1/04*  (2006.01)
*H01R 12/70*  (2011.01)
(Continued)

(52) U.S. Cl.
CPC ....... *H01R 12/7076* (2013.01); *G01R 1/0483* (2013.01); *H01R 12/91* (2013.01); *H05K 7/1023* (2013.01)

(58) Field of Classification Search
CPC ...... H05K 7/10; H05K 7/1053; H05K 7/1061; H05K 7/1069; H01R 12/7076;
(Continued)

(56) References Cited

U.S. PATENT DOCUMENTS 5,807,104 A    9/1998  Ikeya et al.
6,872,083 B2 *  3/2005  Kanesashi ............ H05K 7/1061
                                                    439/264
(Continued)

FOREIGN PATENT DOCUMENTS

JP     8-213128     8/1996
JP     2007-78576   3/2007
JP     2013-134854  7/2013

OTHER PUBLICATIONS

Written Opinion, PCT/ISA/237, dated Feb. 23, 2016, in corresponding International Patent Application No. PCT/JP2015/083735.
(Continued)

*Primary Examiner* — Vanessa Girardi
(74) *Attorney, Agent, or Firm* — Staas & Halsey LLP

(57) ABSTRACT

An electric component socket in which a pressing member is not brought into contact with the tip end of the a contact pin when the socket is pressed by the pressing member in a state where an electric component is not housed in the socket. The electric component socket is provided with a movable plate supported so as to move vertically, a floating plate that is provided above the movable plate and houses the electric component, and a movable spacer that protrudes upward from an upper surface of the movable plate. The electric component socket is configured so that the movable plate is thereby moved downward, thereby enabling the regulating section of the movable plate to move the contact pin downward when the movable spacer is moved downward.

7 Claims, 11 Drawing Sheets

(51) Int. Cl.
*H01R 12/91* (2011.01)
*H05K 7/10* (2006.01)

(58) Field of Classification Search
CPC .... H01R 12/714; H01R 12/71; H01R 12/712; H01R 2201/20; G01R 1/0483; G01R 1/0433; G01R 1/073; G01R 1/07307
See application file for complete search history.

(56) References Cited

U.S. PATENT DOCUMENTS

| | | | | |
|---|---|---|---|---|
| 7,335,030 | B2* | 2/2008 | Kunioka | G01R 1/0433 |
| | | | | 324/754.08 |
| 7,837,481 | B1* | 11/2010 | Mahoney | H01R 12/7076 |
| | | | | 439/66 |
| 7,922,498 | B2* | 4/2011 | Lin | G01R 31/2863 |
| | | | | 439/71 |
| 8,876,536 | B2* | 11/2014 | Sandhu | H01R 12/7076 |
| | | | | 439/71 |
| 2013/0164963 | A1 | 6/2013 | Ueyama | |

OTHER PUBLICATIONS

International Search Report, PCT/ISA/210, dated Feb. 23, 2016, in corresponding International Patent Application No. PCT/JP2015/083735.

* cited by examiner

FIG.5
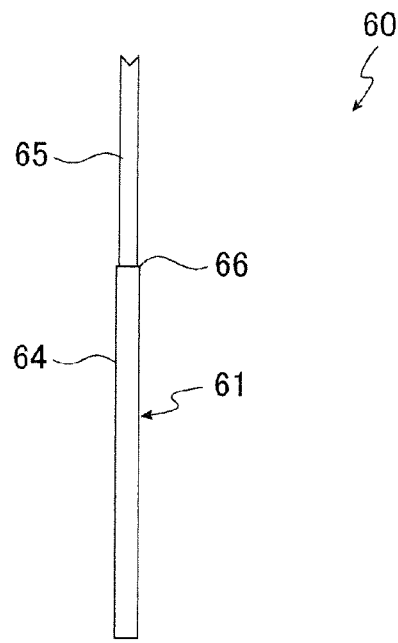
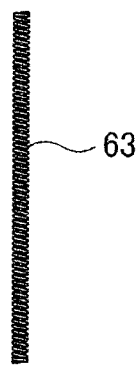
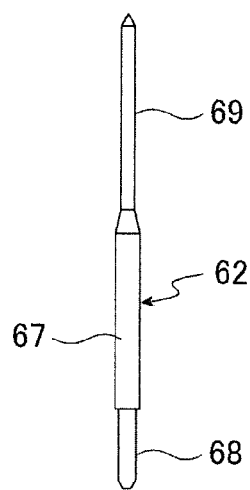

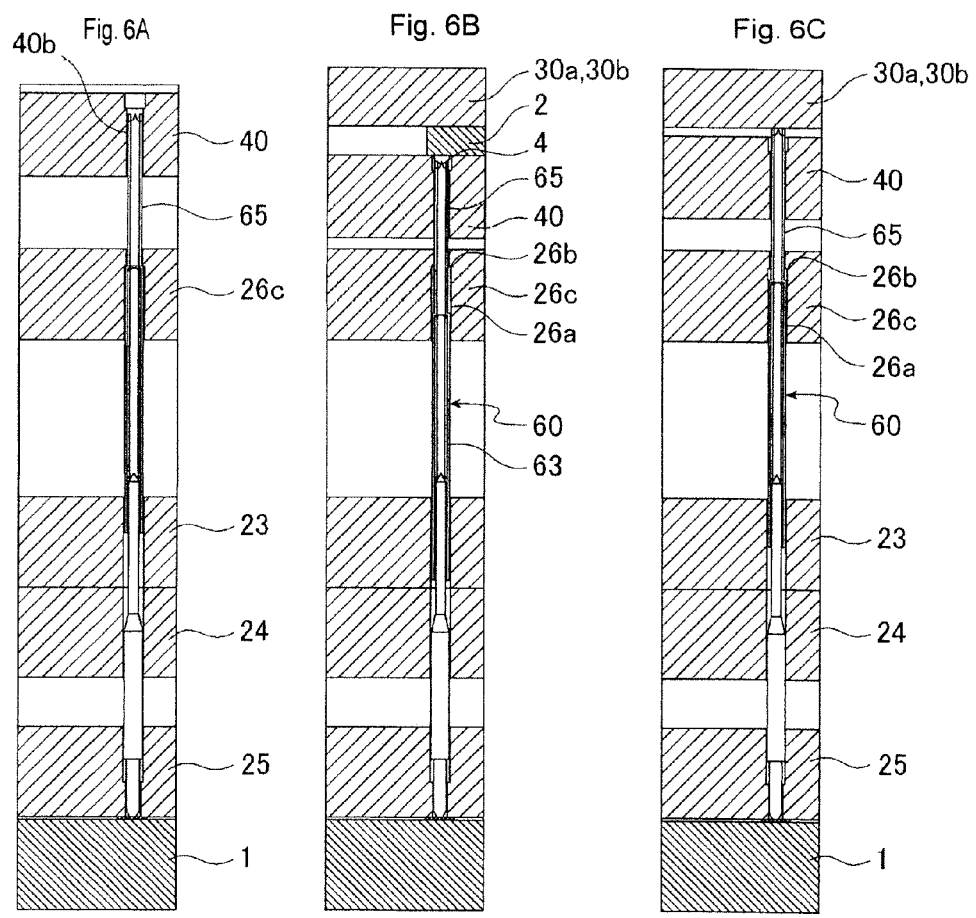

ELECTRIC COMPONENT SOCKET

CROSS-REFERENCE TO RELATED APPLICATIONS

This application is a U.S. National Stage Application, which claims the benefit under 35 U.S.C. § 371 of International Patent Application No. PCT/JP2015/083735, filed Dec. 1, 2015, which claims the foreign priority benefit under 35 U.S.C. § 119 of Japanese Patent Application No. 2014-250548, filed Dec. 11, 2014, the contents of which are incorporated herein by reference.

TECHNICAL FIELD

The present invention relates to an electric component socket that is electrically connected to an electric component such as a semiconductor device (e.g., "IC package").

BACKGROUND ART

Conventionally, among these types of electric component sockets, there is known an IC socket including a contact pin. Such IC socket is adapted to be disposed on a wiring board and to house an IC package that is an object to be inspected. A terminal of this IC package is electrically connected with an electrode of the wiring board through the contact pin to perform tests such as a continuity test.

In such tests, a plurality of IC sockets are aligned, and each IC package is housed in the corresponding IC socket, so that a plurality of IC packages are simultaneously tested to improve the work efficiency (for example, Japanese Patent Laid-Open No. 2007-78576).

The IC package may be pressed by a cooling head for cooling the IC package to maintain a temperature of the IC package at a predetermined temperature during the test (for example, Japanese Patent Laid-Open No. 2007-78576).

When a plurality of the IC sockets are aligned and the IC packages are simultaneously tested as described above, this cooling head is provided to each of all the IC sockets.

SUMMARY OF INVENTION

Technical Problem

However, as in Japanese Patent Laid-Open No. 2007-78576 described above, when the plurality of IC packages are simultaneously tested using the plurality of IC sockets, there may be some IC sockets in which the IC packages are not housed depending on the number of IC packages to be tested. Even in a state where the IC packages are not housed in some IC sockets, all of the cooling heads operate in the same manner. Therefore, in the IC socket in which the IC package is not housed, the cooling head directly contacts the contact pin which may cause the breakage of the contact pin or may cause adhesion of foreign materials to a contact part of the contact pin.

An object of the present invention is to provide an electric component socket in which a breakage of a contact pin or adhesion of foreign materials to a contact part of a contact pin hardly occurs even when the socket is pressed by a pressing mechanism such as a cooling head in a state where an electric component is not housed in the socket.

Solution to Problem

To solve the problems, the present invention provides an electric component socket that includes a socket body in which a first electric component is housed and which is disposed on a second electric component, the first electric component and the second electric component being electrically connected to each other via a contact pin disposed in the socket body. The socket body includes: a movable plate configured to be supported so as to move vertically and energized upward by a plate energizing member; a floating plate configured to be supported above the movable plate so as to move vertically and house the first electric component therein; and a movable spacer configured to protrude upward from a top surface of the movable plate. The contact pin includes: a first conductive contact member configured to be brought into contact with the first electric component; a second conductive contact member configured to be brought into contact with the second electric component; and a spring member configured to energize the first contact member to the first electric component side. The movable plate includes: a first through-hole configured to pass the first contact member of the contact pin therethrough: and a regulating section configured to regulate an upward movement of the first contact member. The floating plate includes: a second through-hole configured to pass the first contact member of the contact pin therethrough; and a third through-hole configured to insert the movable spacer thereinto. When the movable spacer moves downward, the movable plate moves downward against energization force of the plate energizing member, thereby enabling the regulating section of the movable plate to move the first contact member of the contact pin downward.

In the present invention, it is desirable to provide a pressing member that abuts against a body of the first electric component and the movable spacer to press downward when the first electric component is housed in the floating plate, and that abuts against the floating plate and the movable spacer to press downward when the first electric component is not housed in the floating plate.

In the present invention, it is desirable that the pressing member is configured to abut against the body of the first electric component to move the floating plate downward by a predetermined distance, thereafter to abut against the movable spacer to start moving the movable plate downward so that the floating plate comes close to the movable plate when the first electric component is housed in the floating plate, and to abut against the floating plate and the movable spacer almost simultaneously to move the floating plate and the movable plate downward without substantially coming close to each other when the first electric component is not housed in the floating plate.

In the present invention, it is desirable that the regulating section of the movable plate is configured so that the first contact member of the contact pin comes closer and into contact with a terminal provided on a bottom surface of the first electric part when the first electric component is housed in the floating plate, and so that the first contact member of the contact pin is not brought into contact with the bottom surface of the pressing member when the first electric component is not housed in the floating plate.

In the present invention, it is desirable to further provide a fixed spacer that regulates the highest position of the movable plate.

In the present invention, it is desirable that the fixed spacer and the movable spacer are coaxially disposed.

In the present invention, it is desirable that the fixed spacer has a large-diameter upper end part and a small-diameter leg part; the movable spacer is formed in a cylindrical shape opened on its top surface, and has a fourth through-hole with a diameter smaller than that of the upper end part of the fixed spacer and larger than that of the leg part, the fourth through-hole being formed in the bottom surface of the movable spacer; the movable plate has a fifth through-hole formed to insert the leg part of the fixed spacer; and the movement upward relative to the highest position of the movable plate is regulated by inserting the leg part of the fixed spacer into the fourth through-hole in the movable spacer and the fifth through-hole in the movable plate and by fixing the leg part to the socket body in a state where the upper end part of the fixed spacer is housed in the movable spacer.

Advantageous Effects of Invention

According to the present invention, the movable spacer is moved downward, and the movable plate is thereby moved downward. Thus, the regulating section of the movable plate allows the first contact member of the contact pin to be moved downward so that the first contact member is housed in the second through-hole, thereby preventing the contact pin from being broken or foreign materials from adhering to the first contact member of the contact pin.

According to the present invention, the movable spacer is pressed by the pressing member with the above-described configuration, thereby moving both of the floating plate and the movable plate downward.

The floating plate and the movable plate can come close to each other by using the pressing member only when the first electric component is housed in the floating plate.

Furthermore, with such a configuration, the contact pin can be brought into contact with the terminal of the first electric component only when the first electric component is housed in the floating plate.

According to the present invention, the highest position of the movable plate can be regulated by providing the fixed spacer.

According to the present invention, the fixed spacer and the movable spacer are coaxially disposed, thereby facilitating disposing the movable spacer around a region where the contact pin is disposed.

According to the present invention, the fixed spacer and the movable spacer are integrated, thereby facilitating disposing the fixed spacer and the movable spacer coaxially.

BRIEF DESCRIPTION OF DRAWINGS

FIG. 5 is a sectional view illustrating conceptually a configuration of a contact pin of the electric component socket according to Embodiments 1, 2 of the present invention.

FIGS. 6A, 6B, and 6C are sectional views each illustrating conceptually a structure of main portions of the electric component socket according to a comparative example.

DESCRIPTION OF EMBODIMENTS

Figure 1:
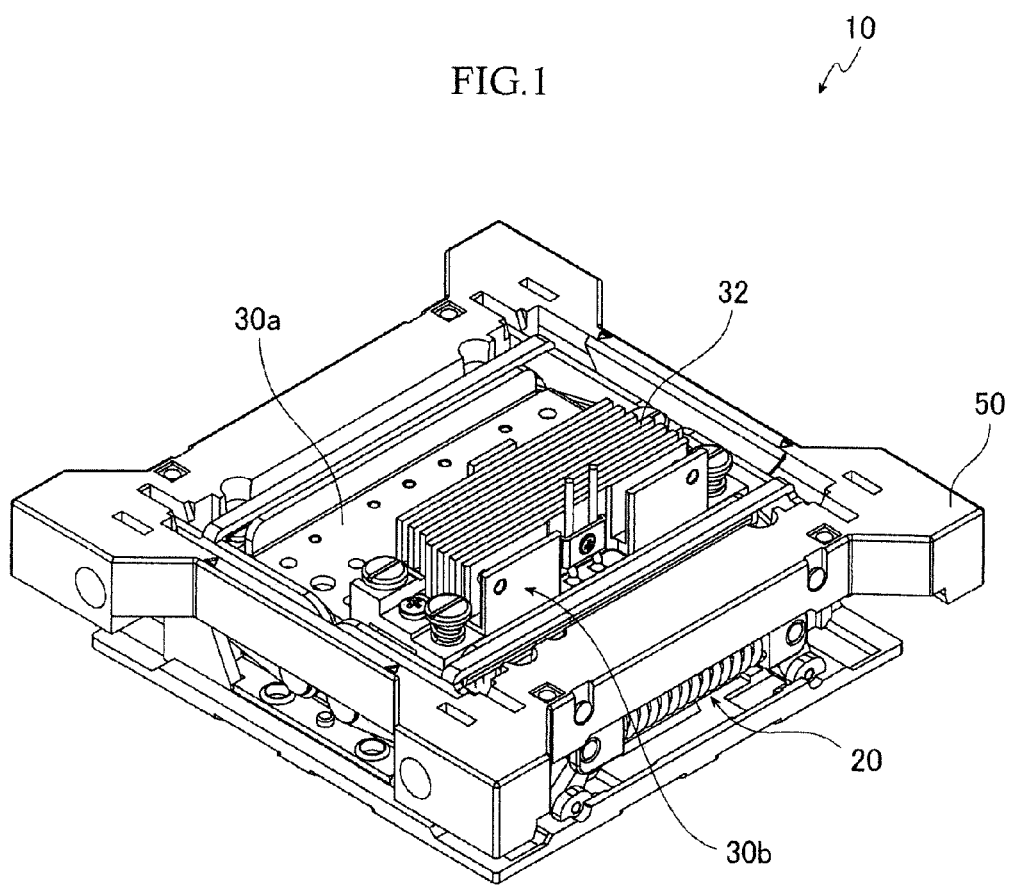
FIG. 1 is an external perspective view illustrating an electric component socket according to Embodiments 1, 2 of the present invention.

Embodiments of the present invention are described below.

Embodiment 1 of Invention

Embodiment 1 of the present invention is illustrated in FIG. 1 to FIG. 5.

As illustrated in each figure, an IC socket 10 as an "electric component socket" in Embodiment 1 is disposed on a wiring board 1 as a "second electric component", and houses an IC package 2 as a "first electric component" on an upper surface of the IC socket 10 so that an electrode (not illustrated) of the wiring board 1 is electrically connected to a terminal 4 of the IC package 2. The IC socket 10 is used as a test apparatus for a continuity test such as a burn-in test for the IC package 2, for example.

In the IC package 2 in Embodiment 1, a plurality of terminals 4 (for example, spherical solder ball, see FIG. 4) are disposed in a matrix form in a predetermined substantially square-shaped range on a bottom surface of a substantially square shaped package body 3.

Figure 2A:
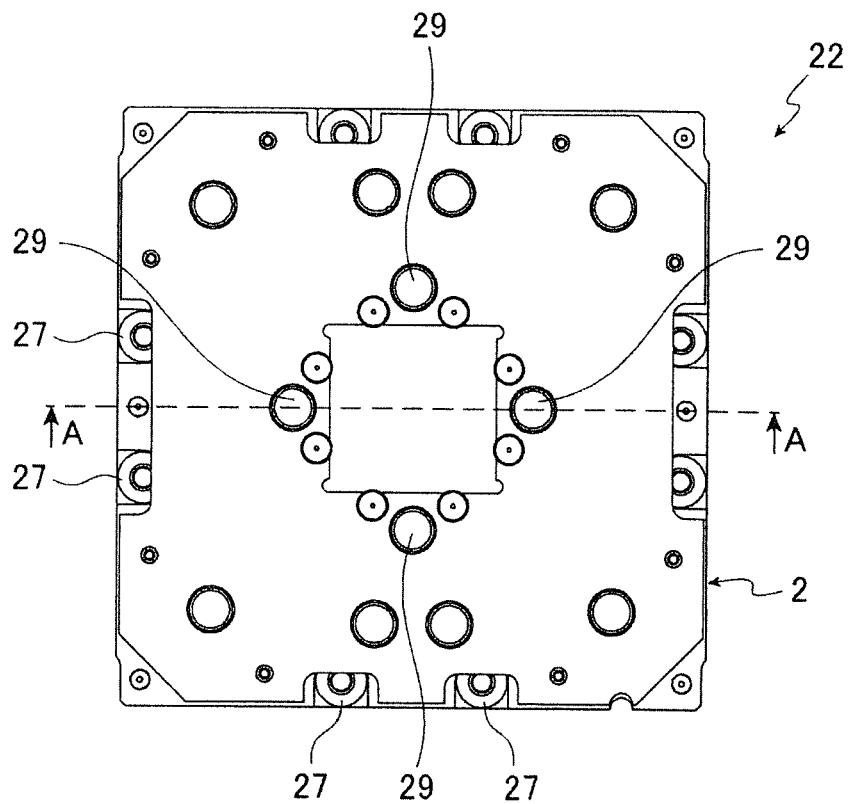
FIG. 2A is a plan view illustrating conceptually a contact module of a socket body of the electric component socket according to Embodiment 1 of the present invention.
Figure 2B:
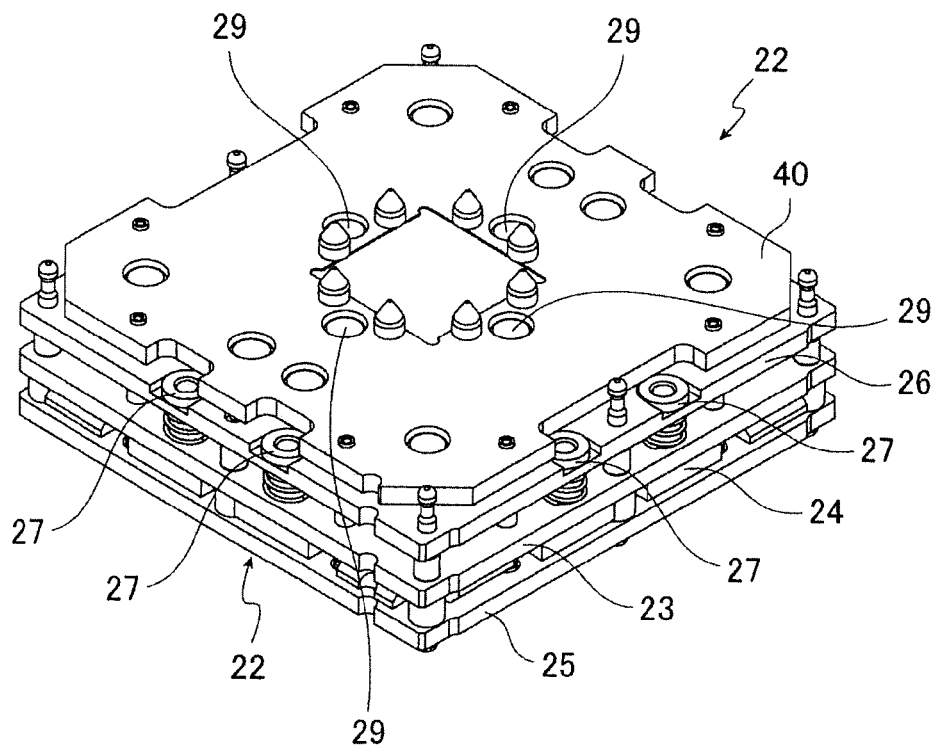
FIG. 2B is a perspective view illustrating conceptually the contact module of the socket body of the electric component socket according to Embodiment 1 of the present invention.
Figure 3:
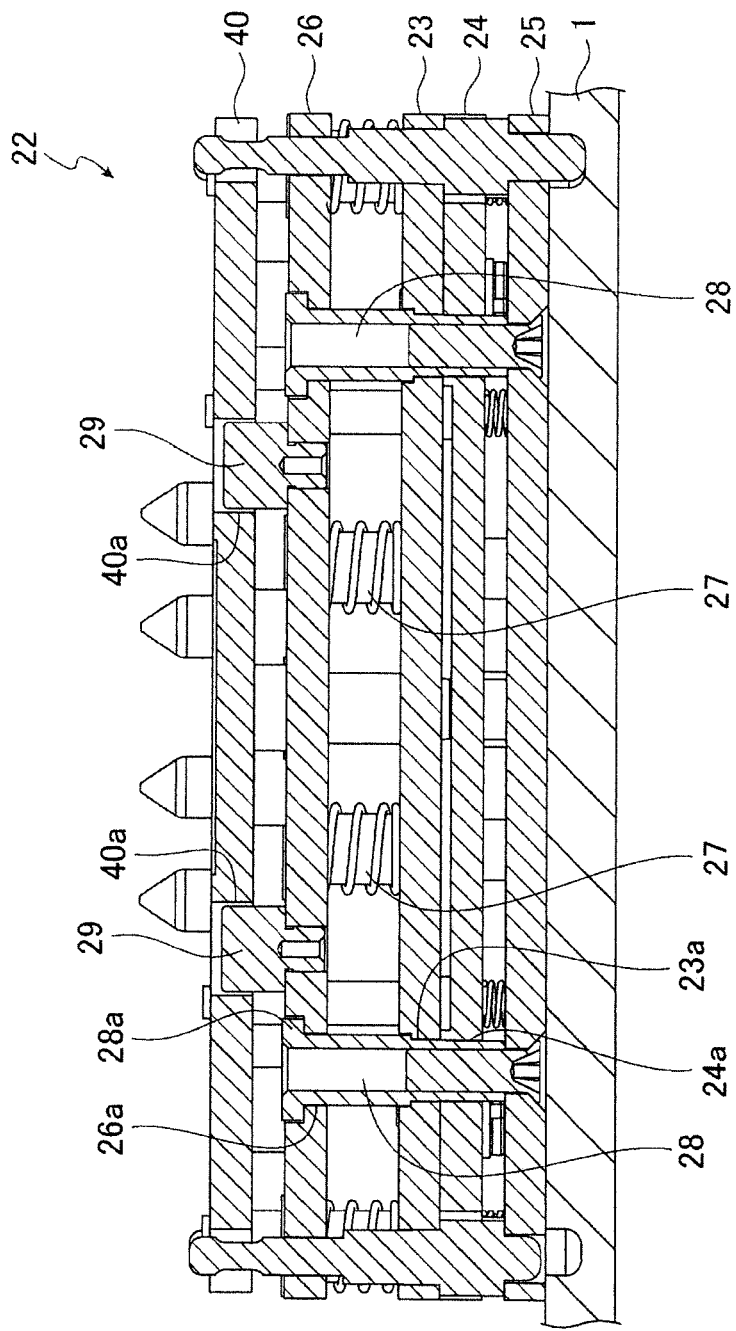
FIG. 3 is a sectional view taken along line A-A of FIG. 2A.
Figure 4:
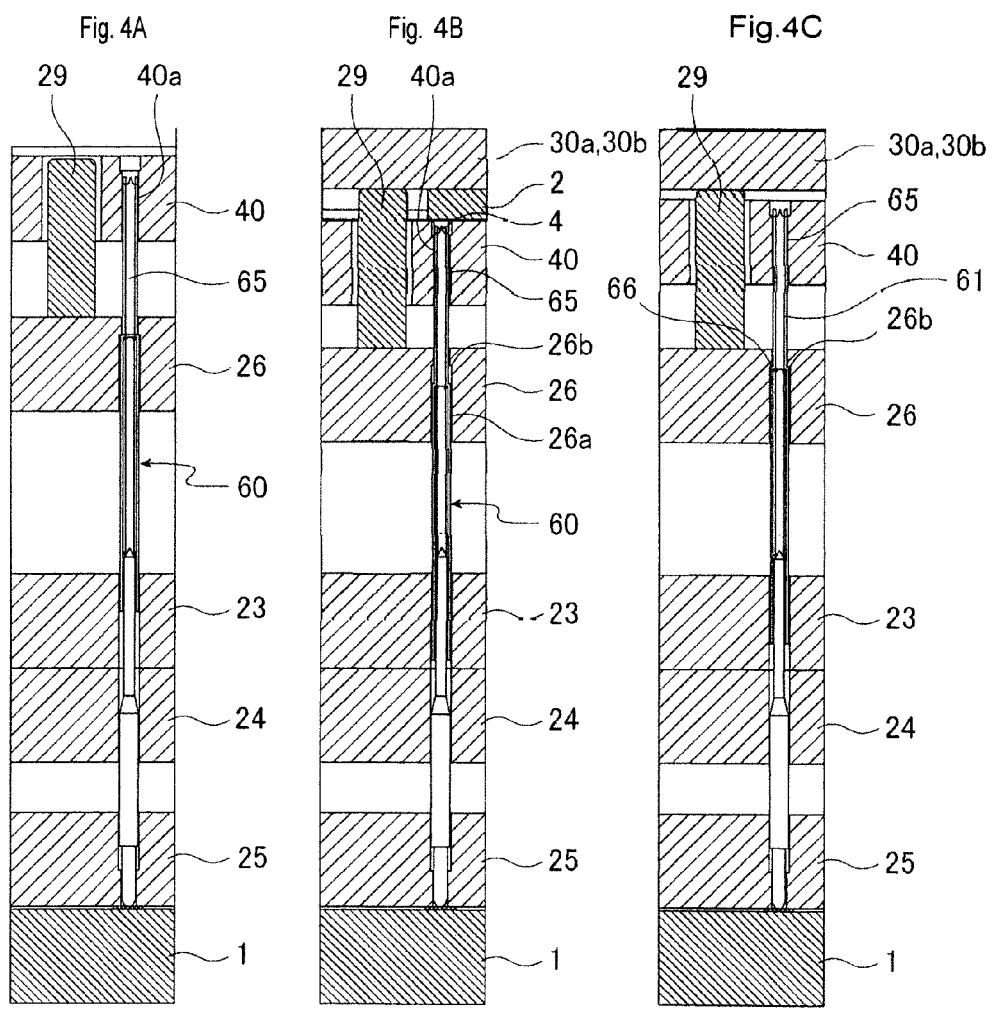
FIGS. 4A, 4B, and 4C are sectional views each illustrating conceptually a structure of main portions of the electric component socket according to Embodiment 1 of the present invention.

The IC socket 10 includes: a socket body 20 disposed on the wiring board 1; a pair of cover members 30a, 30b as "pressing members" configured to turn with respect to the socket body 20 and openably provided; and a flame-like operation member 50 that operates the turning of these cover members 30a, 30b, as illustrated in FIG. 1 to FIG. 3. Note that the cover member 30b is provided with a heat sink 32 for cooling the IC package 2.

The socket body 20 includes a contact module 22 of a substantial square shape in a plan view (see FIG. 2A and FIG. 2B). The contact module 22 has a plurality of contact pins 60 (see FIG. 4A, FIG. 4B, FIG. 4C, FIG. 5, etc.) disposed in a matrix form, and is adapted to house the IC package 2 on an upper surface side of the contact pins 60.

This contact module 22 includes an upper-side fixed plate 23, a center fixed plate 24, a lower-side fixed plate 25, a movable plate 26, and a floating plate 40, and the like, as illustrated in FIG. 2B, FIG. 3 and the like.

The upper-side fixed plate 23, the center fixed plate 24 and the lower-side fixed plate 25 are fixed and held at a predetermined interval. The movable plate 26 is provided above the upper-side fixed plate 23 so as to move vertically.

Plate energizing members 27 are provided between the movable plate 26 and the upper-side fixed plate 23. The movable plate 26 is energized upward by the plate energizing members 27.

Fixed spacers 28 are provided on the lower-side fixed plate 25 (see FIG. 3). The fixed spacer 28 is disposed so as to pass through through-holes 24*a*, 23*a*, and 26*a* which are provided in the center fixed plate 24, the upper-side fixed plate 23 and the movable plate 26, respectively. An upper end of the fixed spacer 28 is protruded upward of the movable plate 26. A flange part 28*a* is provided to the protruded upper end of the fixed spacer 28 to abut against a top surface of the movable plate 26. Thus, in the through-hole 26*a*, the flange part 28*a* of the fixed spacer 28 abuts against a boundary surface between an upper-side part and a lower-side part of the through-hole 26*a* when the movable plate 26 is energized by the plate energizing members 27 to be moved upward. Then, the highest position of the movable plate 26 is regulated.

The floating plate 40 is provided above the movable plate 26. This floating plate 40 is energized upward by springs (not illustrated).

Movable spacers 29 are fixed to the top surface of the movable plate 26. The movable spacer 29 is inserted into a through-hole 40*a* as a "third through-hole" which is provided in the floating plate 40.

The contact pin 60 includes a first cylindrical conductive plunger 61 with step, a second round rod-shaped conductive plunger 62 with step, and a coil spring 63, as illustrated in FIG. 5.

The first plunger 61 includes: an outer cylinder part 64 having an inner diameter larger than an outer diameter of the coil spring 63; a first contact member 65 having an inner diameter smaller than the outer diameter of the coil spring 63; and a stepped part 66 that connects the outer cylinder part 64 and the first contact member 65. As described later, the stepped part 66 abuts against a step part 26*b* as a "regulating section" that is provided in the through-hole 26*a* as a "first through-hole" provided in the movable plate 26, thereby regulating an upward movement of the contact pin 60. As described later, the first contact member 65 can be brought into contact with the terminal 4 of the IC package 2 by moving the floating plate 40 downward.

The second plunger 62 includes: a body part 67 having an outer diameter larger than the inner diameter of the outer cylinder part 64 of the first plunger 61; a second contact part 68 having an outer diameter smaller than the outer diameter of the body part 67; and an inner contact part 69 having an outer diameter smaller than the inner diameter of the outer cylinder part 64 of the first plunger 61. The inner contact part 69 is inserted into the outer cylinder part 64 of the first plunger 61 in a vertically movable manner. The inner contact part 69 is formed in a tapered shape having a diameter enlarged from an upper end (one end on the first plunger 61 side) toward a lower end, that is a diameter at the lower end is larger than a diameter at the upper end. The inner contact part 69 is configured to be brought into contact with an inner surface of the outer cylinder part 64 for conduction. When the wiring board 1 is disposed at a predetermined position of the lower surface of the socket body 20, the second contact part 68 of the second plunger 62 is brought into contact with the electrode of the wiring board 1.

The coil spring 63 as a "spring member" is inserted into the outer cylinder part 64 of the first plunger 61. The upper end of the coil spring 63 is brought into contact with the stepped part 66 of the first plunger 61, the lower end of the coil spring 63 is brought into contact with one end of the inner contact part 69 of the second plunger 62, and the second plunger 62 is thereby energized downward.

In the present embodiment, a plurality of contact pins 60 are disposed in the socket body 20 in a matrix manner as described above. However, in FIG. 5, only one contact pin 60 is conveniently illustrated.

Actions of the IC socket 10 according to Embodiment 1 are described using FIG. 4A, FIG. 4B, FIG. 4C, FIG. 6A, FIG. 6B, and FIG. 6C. FIG. 4A, FIG. 4B, and FIG. 4C are conceptual sectional views of the IC socket 10 according to Embodiment 1. FIG. 6A, FIG. 6B, and FIG. 6C are conceptual sectional views of the IC socket 10 according to a comparative example.

The IC socket 10 of the comparative example illustrated in FIG. 6A, FIG. 6B, and FIG. 6C is not provided with the movable spacer 29, but is provided with a fixed type plate 26*c* instead of the movable plate 26. In such an IC socket 10, when the floating plate 40 is located at the highest position as illustrated in FIG. 6A, a tip end of the first contact member 65 of the contact pin 60 is housed in a through-hole 40*b* provided in the floating plate 40.

When the IC package 2 is housed on the floating plate 40 and the cover members 30*a*, 30*b* are turned and closed, the IC package 2 is moved downward by pressing force of the cover members 30*a*, 30*b* as illustrated in FIG. 6B, and the floating plate 40 is also thereby moved downward. Therefore, the terminals 4 of the IC package 2 are brought into contact with the tip end of the first contact member 65 of the contact pin 60. When the IC package 2 and the floating plate 40 are further moved downward from this state, the first contact member 65 is moved downward against energizing force of the coil spring 63 of the contact pin 60. The terminals 4 of the IC package 2 are thereby brought into contact with the first contact member 65 of the contact pin 60 at a proper contact pressure.

On the other hand, in the case where the cover members 30*a*, 30*b* are closed without housing the IC package 2 on the floating plate 40, when the floating plate 40 is moved downward, the cover members 30*a*, 30*b* are brought into contact with the tip end of the first contact member 65 of the contact pin 60 as illustrated in FIG. 6C which may cause the breakage of the contact pin 60 or may cause adhesion of foreign materials to a contact part of the contact pin.

On contrary to this, the IC socket 10 of Embodiment 1 illustrated in FIG. 4A, FIG. 4B, and FIG. 4C is provided with a movable spacer 29 and a movable plate 26. In such an IC socket 10, in the state where the floating plate 40 is located at the highest position as illustrated in FIG. 4A, the tip end of the first contact member 65 of the contact pin 60 is housed in the through-hole 40*a* as a "second through-hole" that is provided in the floating plate 40.

When the IC package 2 is housed on the floating plate 40 and the cover members 30*a*, 30*b* are closed, the IC package 2 is moved downward by the pressing force of the cover members 30*a*, 30*b* as illustrated in FIG. 4B, and the floating plate 40 is also thereby moved downward. The terminals 4 of the IC package 2 are brought into contact with the first contact member 65 of the contact pin 60.

When the cover members 30*a*, 30*b* are further moved downward, a top surface of the movable spacer 29 abuts against bottom surfaces of the cover members 30*a*, 30*b*, and the movable plate 26 and the floating plate 40 are thereby moved downward in a state separated from each other at a predetermined distance. The first contact member 65 of the contact pin 60 is further moved downward against the energizing force of the coil spring 63.

In Embodiment 1, when the cover members 30*a*, 30*b* are moved downward in a state where the IC package 2 is housed, the floating plate 40 and the movable plate 26 come close to each other by the height difference between the top surface of the IC package 2 and the upper end of the movable spacer 29, so that the first contact member 65 and the terminals 4 of the IC package 2 come into contact with each other. When the cover members 30a, 30b are further moved downward, a contact pressure between the first contact member 65 of the contact pin 60 and the terminals 4 of the IC package 2 is set at a proper value, and the contact pressure between the second plunger 62 and the wiring board 1 is also set at a proper value.

Thereafter, a test (e.g., burn-in test) for the IC package 2 is performed.

On the other hand, in the case where the cover members 30a, 30b are closed without housing the IC package 2 on the floating plate 40, the cover members 30a, 30b abut against the movable spacer 29 as illustrated in FIG. 4C, and the movable plate 26 is also thereby moved downward. The step part 26b of the movable plate 26 abuts against and presses down the stepped part 66 of the first plunger 61, and the first contact member 65 of the first plunger 61 is thereby pressed down. The cover members 30a, 30b also abut against the top surface of the floating plate 40 to press down the floating plate 40.

When the IC package 2 is not housed on the floating plate 40, the movable spacer 29 and the floating plate 40 are pressed down by the same surfaces of the cover members 30a, 30b. When the movable spacer 29 is moved downward, the movable plate 26 is moved downward, and the first plunger 61 is also moved downward. At this time, theoretically, the floating plate 40 and the movable plate 26 come close to each other or are separated from each other by a distance corresponding to the height difference between the top surface of the floating plate 40 and the upper end of the movable spacer 29. However, the change in distance is small as compared to the case where the IC package 2 is housed on the floating plate 40, and the distance is almost the same as that before the cover members 30a, 30b are closed, substantially. The tip end of the first contact member 65 maintains the state of being housed in the through-hole 40a in the floating plate 40. As a result, the cover members 30a, 30b are not brought into contact with the tip end of the first contact member 65 of the contact pin 60.

As described above, according to Embodiment 1, even when the IC package is not housed, the cover members 30a, 30b are not brought into contact with the tip end of the first contact member 65 of the contact pin 60, thereby preventing the contact pin 60 from being broken or foreign materials from adhering to the tip end of the first contact member 65 of the contact pin 60.

Embodiment 2 of Invention

Embodiment 2 of the present invention is illustrated in FIG. 7A to FIG. 9B. Note that in FIG. 7A to FIG. 9B, components denoted by the same reference numerals as FIG. 1 to FIG. 5 show the same as FIG. 1 to FIG. 5.

Figure 7A:
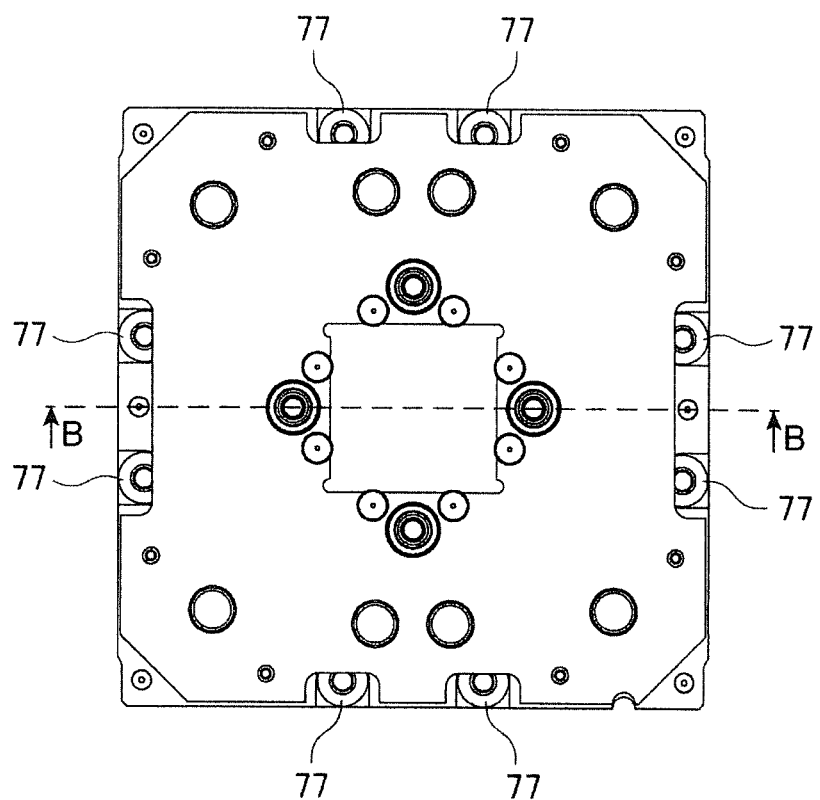
FIG. 7A is a plan view illustrating conceptually a contact module of a socket body of the electric component socket according to Embodiment 2 of the present invention.
Figure 7B:
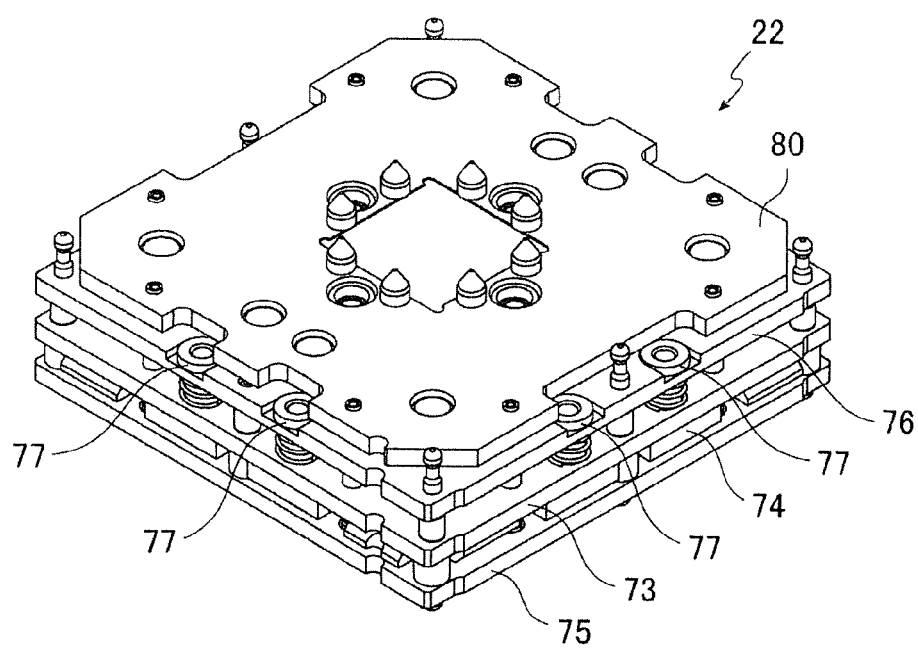
FIG. 7B is a perspective view illustrating conceptually the contact module of the socket body of the electric component socket according to Embodiment 2 of the present invention.
Figure 8:
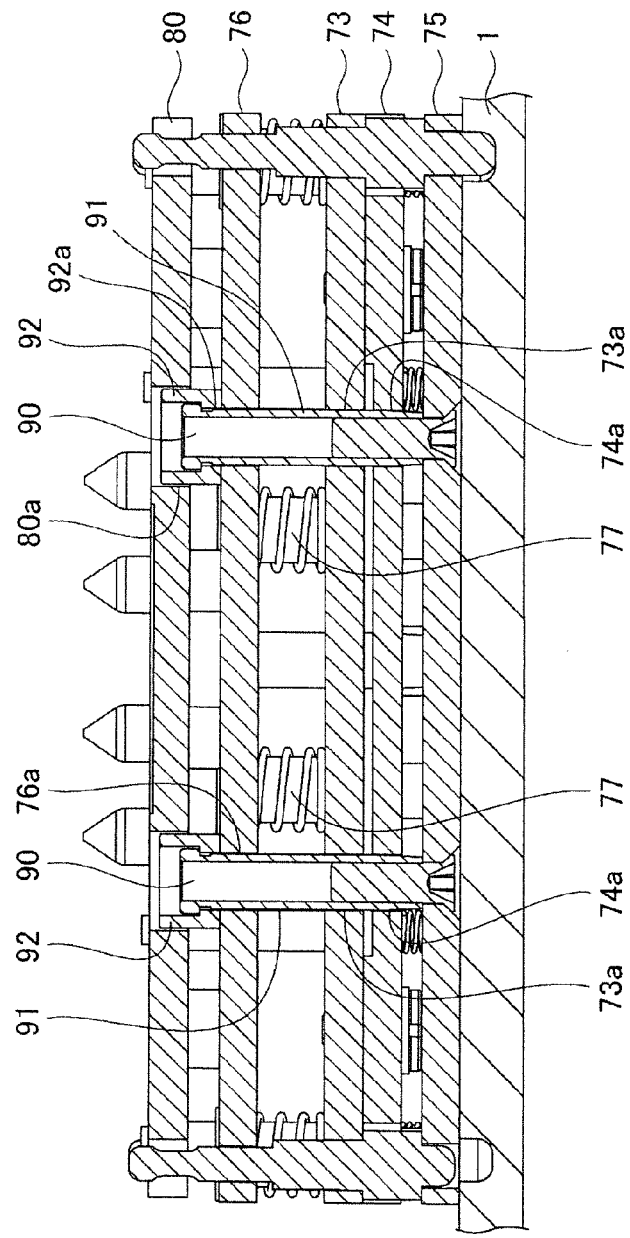
FIG. 8 is a sectional view taken along line B-B of FIG. 7A.

The contact module 22 of Embodiment 2 includes an upper-side fixed plate 73, a center fixed plate 74, a lower-side fixed plate 75, a movable plate 76, a floating plate 80, and the like, as illustrated FIG. 7B, FIG. 8 and the like.

The upper-side fixed plate 73, the center fixed plate 74 and the lower-side fixed plate 75 are fixed and held at a predetermined interval. The movable plate 76 is provided above the upper-side fixed plate 73 so as to move vertically.

Plate energizing members 77 are provided between the movable plate 76 and the upper-side fixed plate 73. The movable plate 76 is energized upward by the plate energizing members 77.

Figure 9A:
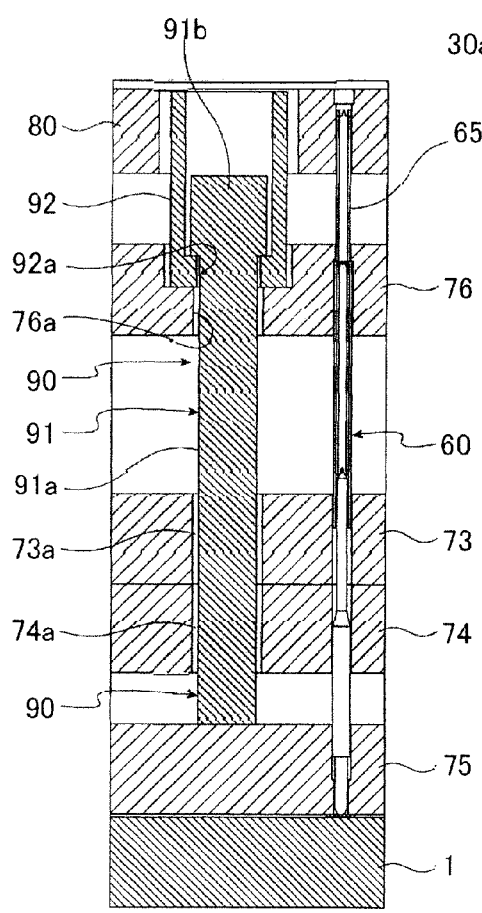
FIGS. 9A and 9B are sectional views each illustrating conceptually a structure of main portions of the electric component socket according to Embodiment 2 of the present invention.
Figure 9B:
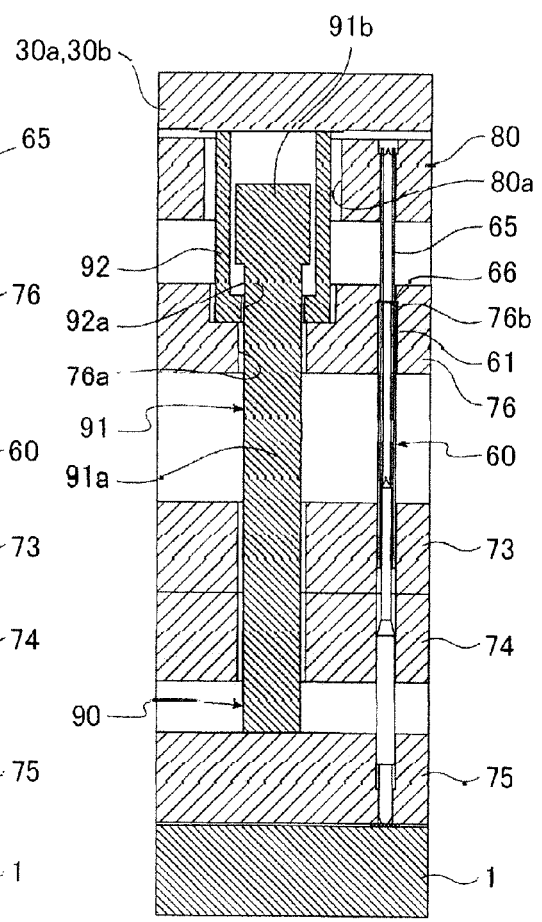

Expansion type spacer members 90 are provided on the lower-side fixed plate 75 (see FIG. 8 and FIGS. 9A and 9B). The expansion type spacer member 90 includes: a fixed spacer part 91 that regulates the highest position of the movable plate 76; and a movable spacer part 92 provided to the movable plate 76. The fixed spacer part 91 includes: a leg part 91a formed in a rod shape; and an upper end part 91b having a diameter larger than that of the leg part 91a. On the other hand, the movable spacer part 92 is formed in a cylindrical shape opened on its top surface, and a through-hole 92a as a "fourth through-hole" is formed in the bottom surface of the movable spacer part 92. The through-hole 92a has a diameter larger than that of the leg part 91a of the fixed spacer part 91 but smaller than that of the upper end part 91b. The fixed spacer part 91 is disposed in a state where the upper end part 91b thereof is housed in the movable spacer part 92 so that the leg part 91a of the fixed spacer part 91 is protruded downward from the through-hole 92a.

The fixed spacer part 91 of the expansion type spacer member 90 is disposed on the lower-side fixed plate 75. The fixed spacer part 91 passes through through-holes 74a, 73a that are provided in the center fixed plate 74 and the upper-side fixed plate 73, respectively, and a through-hole 76a as a "fifth through-hole" provided in the movable plate 76.

The through-hole 76a in the movable plate 76 is formed so that an upper-side part thereof has a diameter larger than that of the movable spacer part 92 and a lower-side part thereof has a diameter smaller than that of the movable spacer part 92 and larger than that of a leg part 91a of the fixed spacer part 91. Thus, the bottom surface of the movable spacer part 92 abuts against a boundary surface between an upper-side part and a lower-side part of the through-hole 76a when the movable plate 76 is energized upward by the plate energizing members 77, the highest position of the movable plate 76 is thereby regulated.

The floating plate 80 is provided above the movable plate 76. This floating plate 80 is energized upward by springs (not illustrated).

The movable spacer part 92 of the expansion type spacer member 90 is inserted into a through-hole 80a in the floating plate 80. The upper end part of the movable spacer part 92 abuts against the cover members 30a, 30b.

Actions of the IC socket 10 according to Embodiment 2 are described using FIG. 9A and FIG. 9B. FIG. 9A and FIG. 9B are conceptual sectional views for describing operation of the IC socket 10 according to Embodiment 2.

In the IC socket 10 of Embodiment 2, when the floating plate 40 is located at the highest position as illustrated in FIG. 9A, the tip end of the first contact member 65 of the contact pin 60 is housed in the through-hole 80a in the floating plate 80.

In the case where the cover members 30a, 30b are closed without housing the IC package 2 on the floating plate 80, the cover members 30a, 30b abut against the movable spacer part 92 as illustrated in FIG. 9B, and the movable plate 76 is also thereby moved downward. The step part 76b of the movable plate 76 abuts against and presses down the stepped part 66 of the first plunger 61, and first plunger 61 is thereby pressed down.

The cover members 30a, 30b also abut against the floating plate 80 to press down the floating plate 80.

When the IC package 2 is not housed on the floating plate 80, the movable spacer part 92 and the floating plate 80 are pressed down by the same surfaces of the cover members 30a, 30b. Therefore, a descending distance of the movable plate 76 (i.e., a descending distance of the tip end of the first plunger 61) is the same as a descending distance of the floating plate 80. Therefore, the tip end of the first contact member 65 maintains the state of being housed in the through-hole 80a in the floating plate 80. As a result, the cover members 30a, 30b are not brought into contact with the tip end of the first contact member 65 of the contact pin 60.

The operation when the IC package 2 is housed on the floating plate 80 is the same as Embodiment 1 described above, and therefore the description is omitted.

As described above, according to Embodiment 2, even when the IC package 2 is not housed, the cover members 30a, 30b are not brought into contact with the tip end of the first contact member 65 of the contact pin 60, thereby preventing the contact pin 60 from being broken or foreign materials from adhering to the tip end of the first contact member 65 of the contact pin 60.

The fixed spacer part 91 and the movable spacer part 92 are coaxially disposed, the occupancy areas of the fixed spacer part 91 and the movable spacer part 92 are thereby reduced, and thereby facilitating disposing the movable spacer around a region where the contact pin 60 is disposed.

In Embodiment 2, the fixed spacer part 91 and the movable spacer part 92 are coaxially disposed by integrating the fixed spacer part 91 and the movable spacer part 92. Another configuration can be used when the fixed spacer and the movable spacer are coaxially disposed.

REFERENCE SIGNS LIST 1 wiring board
2 IC package (electric component)
3 package body
4 terminal
10 IC socket (electric component socket)
20 socket body
23 upper-side fixed plate
24 center fixed plate
25 lower-side fixed plate
26 movable plate
27 energizing member
28 fixed spacer
29 movable spacer
30a, 30b cover member
40 floating plate
50 operation member
60 contact pin

The invention claimed is:

1. An electric component socket, comprising:
a socket body in which a first electric component is housed and which is disposed on a second electric component, the first electric component and the second electric component being electrically connected to each other via a contact pin disposed in the socket body,
the socket body including
a movable plate configured to be supported so as to move vertically and energized upward by a plate energizing member,
a floating plate configured to be supported above the movable plate so as to move vertically and house the first electric component therein, and
a movable spacer configured to protrude upward from an upper surface of the movable plate,
the contact pin including
a first conductive contact member configured to be brought into contact with the first electric component, and
a second conductive contact member configured to be brought into contact with the second electric component, and
a spring member configured to energize the first contact member to the first electric component side,
the movable plate including
a first through-hole configured to pass the first contact member of the contact pin therethrough, and
a regulating section configured to regulate an upward movement of the first contact member,
the floating plate including
a second through-hole configured to pass the first contact member of the contact pin therethrough, and
a third through-hole configured to insert the movable spacer thereinto, and
the movable plate moving downward against energization force of the plate energizing member when the movable spacer moves downward, thereby enabling the regulating section of the movable plate to move the first contact member of the contact pin downward.

2. The electric component socket according to claim 1, wherein
a pressing member is provided to abut against a body of the first electric component and the movable spacer to press downward when the first electric component is housed in the floating plate, and to abut against the floating plate and the movable spacer to press downward when the first electric component is not housed in the floating plate.

3. The electric component socket according to claim 2, wherein
the pressing member is configured to abut against the body of the first electric component to move the floating plate downward by a predetermined distance, thereafter to abut against the movable spacer to start moving the movable plate downward so that the floating plate comes close to the movable plate when the first electric component is housed in the floating plate, and
the pressing member is configured to abut against the floating plate and the movable spacer almost simultaneously to move the floating plate and the movable plate downward without substantially coming close to each other when the first electric component is not housed in the floating plate.

4. The electric component socket according to claim 3, wherein
the regulating section of the movable plate is configured so that the first contact member of the contact pin comes closer and into contact with a terminal provided on a bottom surface of the first electric part when the first electric component is housed in the floating plate, and so that the first contact member of the contact pin is not brought into contact with the bottom surface of the pressing member when the first electric component is not housed in the floating plate.

5. The electric component socket according to claim 1, wherein
a fixed spacer is further provided to regulate the highest position of the movable plate.

6. The electric component socket according to claim 5, wherein
the fixed spacer and the movable spacer are coaxially disposed.

7. The electric component socket according to claim 6, wherein
the fixed spacer has a large-diameter upper end part and a small-diameter leg part,
the movable spacer is formed in a cylindrical shape opened on its top surface, and has a fourth through-hole with a diameter smaller than that of the upper end part of the fixed spacer and larger than that of the leg part, the fourth through-hole being formed in the bottom surface of the movable spacer, the movable plate has a fifth through-hole formed to insert the leg part of the fixed spacer, and a movement upward relative to the highest position of the movable plate is regulated by inserting the leg part of the fixed spacer into the fourth through-hole in the movable spacer and the fifth through-hole in the movable plate and by fixing the leg part to the socket body in a state where the upper end part of the fixed spacer is housed in the movable spacer.

\* \* \* \* \*

UNITED STATES PATENT AND TRADEMARK OFFICE
CERTIFICATE OF CORRECTION

PATENT NO.        : 9,972,926 B2
APPLICATION NO.   : 15/534757
DATED             : May 15, 2018
INVENTOR(S)       : Yuki Ueyama Page 1 of 1

It is certified that error appears in the above-identified patent and that said Letters Patent is hereby corrected as shown below:

On the Title Page

Item [57] (Abstract), Line 32:
Delete "the a" and insert -- a --, therefore.

Signed and Sealed this
Sixteenth Day of October, 2018

Andrei Iancu
*Director of the United States Patent and Trademark Office*